(12) United States Patent
Dinh et al.

(10) Patent No.: US 9,047,948 B1
(45) Date of Patent: Jun. 2, 2015

(54) PROGRAMMABLE WINDOW OF OPERATION FOR CBRAM

(75) Inventors: John Dinh, Dublin, CA (US); Nad Edward Gilbert, Gilbert, AZ (US); Shane Hollmer, Grass Valley, CA (US); Derric Lewis, Sunnyvale, CA (US); John Ross Jameson, Burlingame, CA (US); Daniel C. Wang, San Jose, CA (US); Juan Pablo Saenz Echeverry, Mountain View, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 426 days.

(21) Appl. No.: 13/548,429

(22) Filed: Jul. 13, 2012

Related U.S. Application Data

(60) Provisional application No. 61/534,665, filed on Sep. 14, 2011, provisional application No. 61/534,510, filed on Sep. 14, 2011.

(51) Int. Cl.
*G11C 11/00* (2006.01)
*G11C 13/00* (2006.01)

(52) U.S. Cl.
CPC ........ *G11C 13/0069* (2013.01); *G11C 13/0004* (2013.01)

(58) Field of Classification Search
CPC .................. G11C 13/0004; G11C 13/0069
USPC ............ 365/148, 185.2, 163, 189.04, 185.19
See application file for complete search history.

(56) References Cited

U.S. PATENT DOCUMENTS

| 7,675,805 B2 | 3/2010 | Ang et al. | |
| 2008/0112207 A1* | 5/2008 | Pinnow | ......................... 365/148 |
| 2011/0170346 A1* | 7/2011 | Nagai et al. | ................ 365/185.2 |

* cited by examiner

*Primary Examiner* — Richard Elms
*Assistant Examiner* — Mohammed A Bashar
(74) *Attorney, Agent, or Firm* — Michael C. Stephens, Jr.

(57) ABSTRACT

Structures and methods for control of an operating window of a programmable impedance element are disclosed herein. In one embodiment, a semiconductor memory device can include: (i) a memory array having a programmable impedance element; (ii) a register configured to be programmed with data that represents an erase verify value, a program verify value, and a read trip point resistance value, for the memory array; (iii) a controller configured to determine a mode of operation for the memory array; (iv) a register access circuit configured to read the register to obtain data that corresponds to the mode of operation; and (v) a voltage generator configured to generate a reference voltage based on the register data, where the reference voltage is used to perform an operation on the programmable impedance element corresponding to the mode of operation.

18 Claims, 10 Drawing Sheets

PROGRAMMABLE WINDOW OF OPERATION FOR CBRAM

RELATED APPLICATIONS

This application claims the benefit of U.S. Provisional Application No. 61/534,510, filed Sep. 14, 2011, which is incorporated herein by reference in its entirety, and of U.S. Provisional Application No. 61/534,665, filed Sep. 14, 2011, which is incorporated herein by reference in its entirety.

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high programming current, as well as physical degradation of the memory cell over time. Other NVM technologies, such as resistive RAM (ReRAM) and conductive bridging RAM (CBRAM), may offer relatively low power and higher speeds as compared to flash memory technologies. CBRAM utilizes a programmable metallization cell (PMC) technology, which has the potential to scale to smaller sizes than flash memory devices.

SUMMARY

Embodiments of the present invention relate to operating window control of a programmable impedance element.

In one embodiment, a semiconductor memory device can include: (i) a memory array having a programmable impedance element; (ii) a register configured to be programmed with data that represents an erase verify value, a program verify value, and a read trip point resistance value, for the memory array; (iii) a controller configured to determine a mode of operation for the memory array; (iv) a register access circuit configured to read the register to obtain data that corresponds to the mode of operation; and (v) a voltage generator configured to generate a reference voltage based on the register data, where the reference voltage is used to perform an operation on the programmable impedance element corresponding to the mode of operation.

In another embodiment, a method of controlling a programmable impedance element in a memory array, can include: (i) programming a register with data that represents an erase verify value, a program verify value, and a read trip point resistance value, for the memory array; (ii) determining a mode of operation for the memory array; (iii) reading the register to obtain data corresponding to the mode of operation; and (iv) generating a reference voltage based on the register data, where the reference voltage is used to perform an operation on the programmable impedance element corresponding to the mode of operation.

Embodiments of the present invention can advantageously provide for programmable operating window control relative to substantially fixed conventional approaches. Particular embodiments are suitable for resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Figure 1:
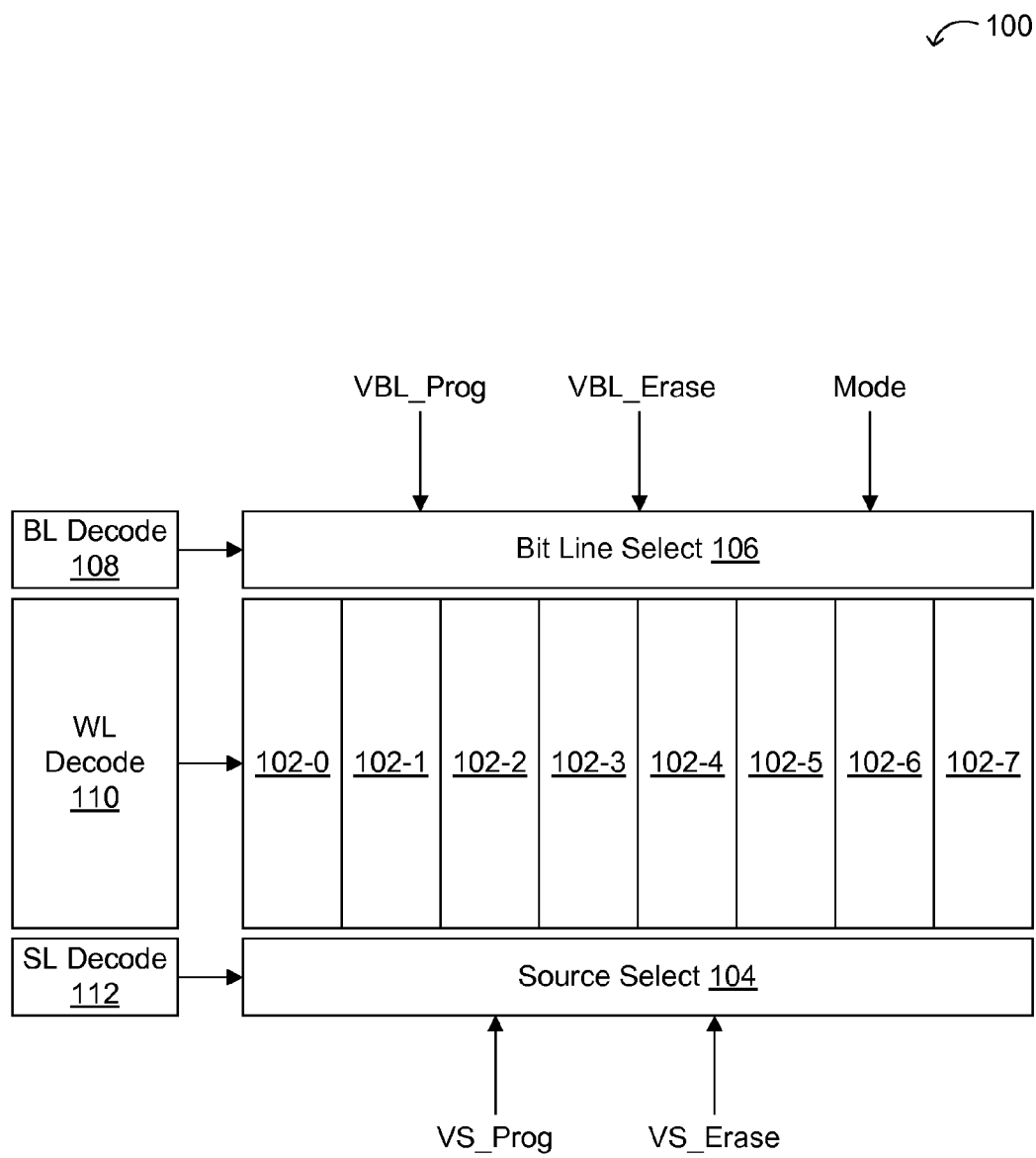
FIG. 1 is an example memory device arrangement.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Particular embodiments may be directed to programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating PMCs that can be programmed/written and erased between one or more resistance and/or capacitive states.

Figure 2:
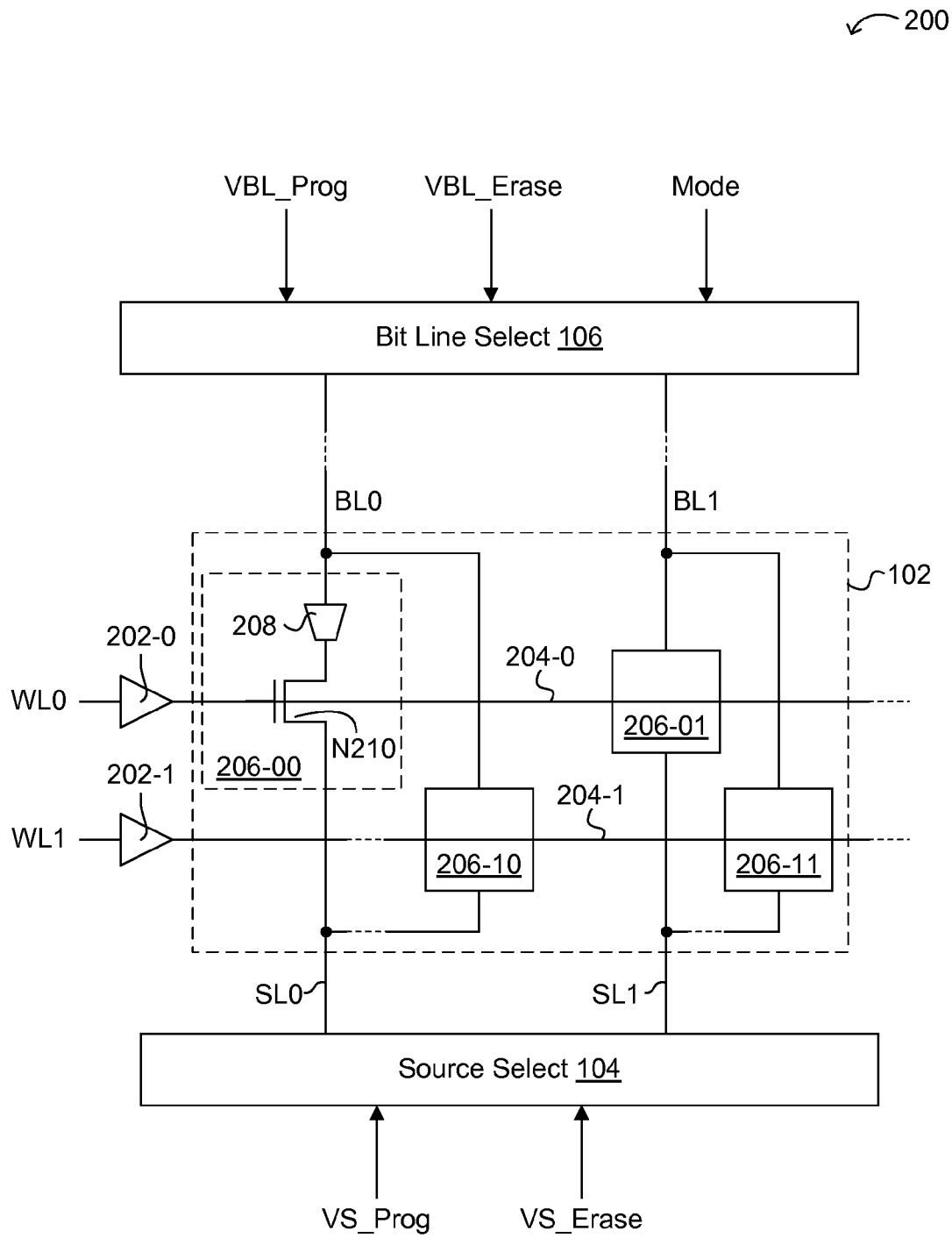
FIG. 2 is a diagram of an example memory device and memory cell structure.

FIGS. 1 and 2 show example memory architectures and circuit structures that can utilize PMCs of particular embodiments. However, PMCs of particular embodiments are suitable for use in a wide variety of memory architectures and circuit structures.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be generated power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage generator (e.g., based on a reference voltage) of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1-V2) in an anode-to-cathode direction. In an erase operation, a PMC to be erased can be connected between suitable voltages (e.g., V2-V1) in an anode-to-cathode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be an erase voltage, which may both be a supply voltage (Vprog=V1−V2, Verase=V2−V1, Supply voltage=V2−V1). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 to thereby select a memory cell 206, thus placing its corresponding access device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation, in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltages and/or currents to enable such access devices. In this way, bit line selection, source selection, and word line activation can be utilized to program and/or erase a PMC array having bit lines connected to anodes of PMCs within multiple memory cells.

While particular example architectures and circuits suitable for PMCs, and memory arrays formed thereof, with respect to FIGS. 1 and 2, programmable impedance elements in certain embodiments are suitable to a wide variety of architectures and/or circuit arrangements.

Figure 3:
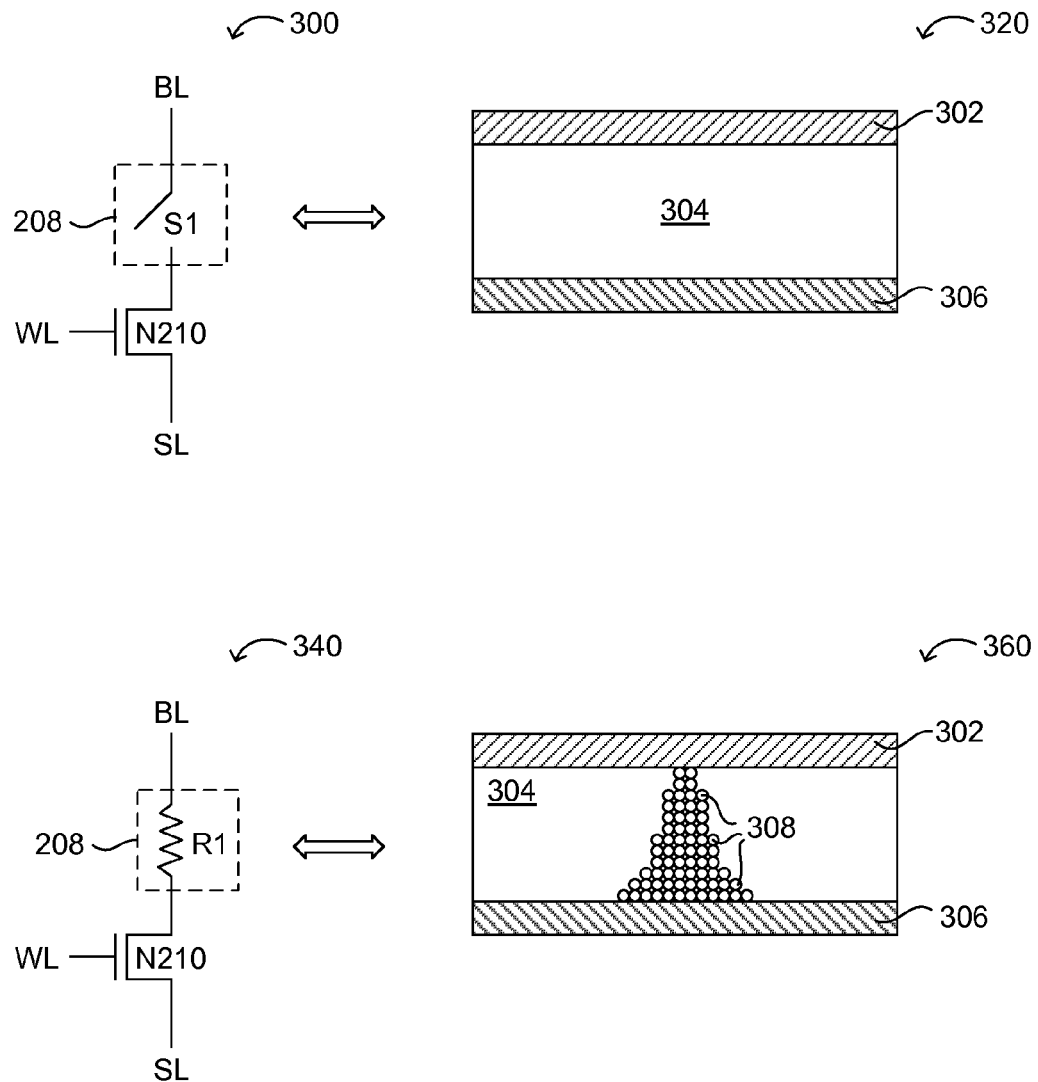
FIG. 3 is a diagram of an example programmable impedance element with schematic modeling.

Referring now to FIG. 3, shown is a diagram of an example programmable impedance element with corresponding schematic modeling. Example 300 shows a memory cell with an open switch S1 representation of PMC 208. The PMC portion of this representation corresponds to the cross-section diagram 320, which represents a PMC or programmable impedance element in a high impedance state (e.g., state "0"), or an erased state. As used herein, "PMC" may be one example of a "programmable impedance element." PMC 320 can include electrochemically active electrode 302, solid electrolyte 304, and inert electrode 306.

Schematic representation 340 and corresponding cross-section diagram 360 show examples of PMC 208 in a low impedance state (e.g., state "1"), or a programmed state. For example, example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in examples 300 and 340, a control transistor (e.g., N210) can also be included in each memory cell including the programmable impedance element or PMC 208. For example, transistor N210 can be controlled by a word line 204, as discussed above with respect to FIG. 2.

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes. Typically, thicker solid electrolytes 304 would yield slower operation, such as in a full erase and program scheme, due to the extra distance that electrodeposits 308 would need to fill. However, thinner films are more challenging from a manufacturing standpoint, such as in the ability to control a variation in a thickness of a relatively thin film. As will be discussed in more detail below, particular embodiments provide a structure and mechanism whereby relatively thick solid electrolyte layers can be made to perform at faster erase and programming speeds, as compared to conventional approaches.

Solid electrolyte 304 can include a chalcogenide compound, such as a germanium selenium (Ge—Se) compound. Solid electrolyte 304 can be formed by photodissolution of metal into a chalcogenide base glass. Chalcogenide materials are chemical compounds consisting of at least one chalcogen ion (a chemical element in column VI of the periodic table, also known as the oxygen family). More precisely, the term chalcogenide refers to the sulphides, selenides, and tellurides. PMCs may utilize the ionic conduction of compounds containing metallic ions.

Certain metals can be added to thin films of chalcogenide glasses by photodissolution. When Ag is combined in this fashion with Ge—Se or Ge—S glasses, the resulting ternary may contain a dispersed nanocrystalline $Ag_2S(e)$ phase that has relatively large quantities of mobile metal ions. The presence of these ions allows the ternaries to act as solid electrolytes. If an anode that has an oxidizable form of the ionic metal and an inert cathode are applied in contact with such a phase-separated electrolyte, an ion current of mobile elements (e.g., positively charged metal ions) can flow under an applied voltage bias. Electrons from the cathode can reduce the excess metal due to the ion flux and an electrodeposit (e.g., 308) forms on or in the electrolyte (e.g., 304). Also, other materials, such as certain oxides (e.g., tungsten oxide, hafnium oxide, nickel oxide, titanium oxide, transition metal oxides, etc.), can be used, as opposed to Ge—S and Ge—Se chalcogenide glasses. In addition, other metals, such as copper, can be used in place of silver, for the electrochemically active electrode that supplies mobile ions.

Various materials can be utilized to form electrodes 302 and 306. For example, inert electrode 306 can include tungsten, and electrochemically active electrode 302 can include silver or copper. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 µA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "1" data value stored in that cell. However, if there is no nanowire or conductive path between electrodes in the cell (e.g., 320), the resistance is higher, leading to low current, and that can be read as a "0" data value stored in that cell.

Cell data can be erased in similar fashion to cell writing, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC can be substantially symmetric to a program or write operation.

Thus in conductive bridging random-access memory (CBRAM) applications, metal ions can dissolve readily in the material (e.g., 304) between the two electrodes (e.g., 302 and 306). In contrast, in resistive RAM (ReRAM) applications, the material between the electrodes may require a high electric field that can cause local damage in may produce a trail of conducting defects (a "filament"). Thus, for CBRAM, one electrode provides the dissolving ions, while for ReRAM, a one-time "forming" step may be required to generate the local damage.

However, due to the operation mechanism and filamentary nature of ReRAM devices and/or CBRAM, there may be variations intrinsic to these devices. For example, the time-to-program and on/off resistance values may have relatively wide distributions, and such wide distributions can make associated memory array design more difficult. Electrodeposits 308 may not form in a substantially repeatable pattern for subsequent programming cycles, and may also take a relatively long time to form the completed conduction path between electrodes 302 and 306. In particular embodiments, however, intrinsic variation can be lowered by restricting a number of possible pathways, or by otherwise predefining possible bridging paths.

Example Window of Operation Programmable Control for CBRAM

In one embodiment, a semiconductor memory device can include: (i) a memory array having a programmable impedance element; (ii) a register configured to be programmed with data that represents an erase verify value, a program verify value, and a read trip point resistance value, for the memory array; (iii) a controller configured to determine a mode of operation for the memory array; (iv) a register access circuit configured to read the register to obtain data that corresponds to the mode of operation; and (v) a voltage generator configured to generate a reference voltage based on the register data, where the reference voltage is used to perform an operation on the programmable impedance element corresponding to the mode of operation.

For example, if the mode of operation is a program operation, the reference voltage may be used in performing a program verify as part of the program operation on the programmable impedance element. Similarly, if the mode of operation is an erase operation, the reference voltage may be used to perform an erase verify as part of the erase operation on the programmable impedance element. Also, if the mode of operation is a read operation, the reference voltage may be used in setting the read trip point for performing the read operation on the programmable impedance element. A reference current may also used in one or more of the above operations.

An operating window (see, e.g., FIG. 5) may be defined by program verify, erase verify, and read trip point resistance values. In a fixed operating window that defines one or zero storage states, if there is a change in performance characteristics of the memory, there may be skew in one way or the other relative to the window. In particular embodiments, an option to change the operating window through programming a register is provided. In this way, the operating window may be adjusted to favor a one or a zero. Particular embodiments include a programmable register that allows for changes in resistance values that define a one or zero state. From the programmable register, program and erase verify voltages can be adjusted, thus adjusting the window of operation, as will be discussed in more detail below.

Figure 4:
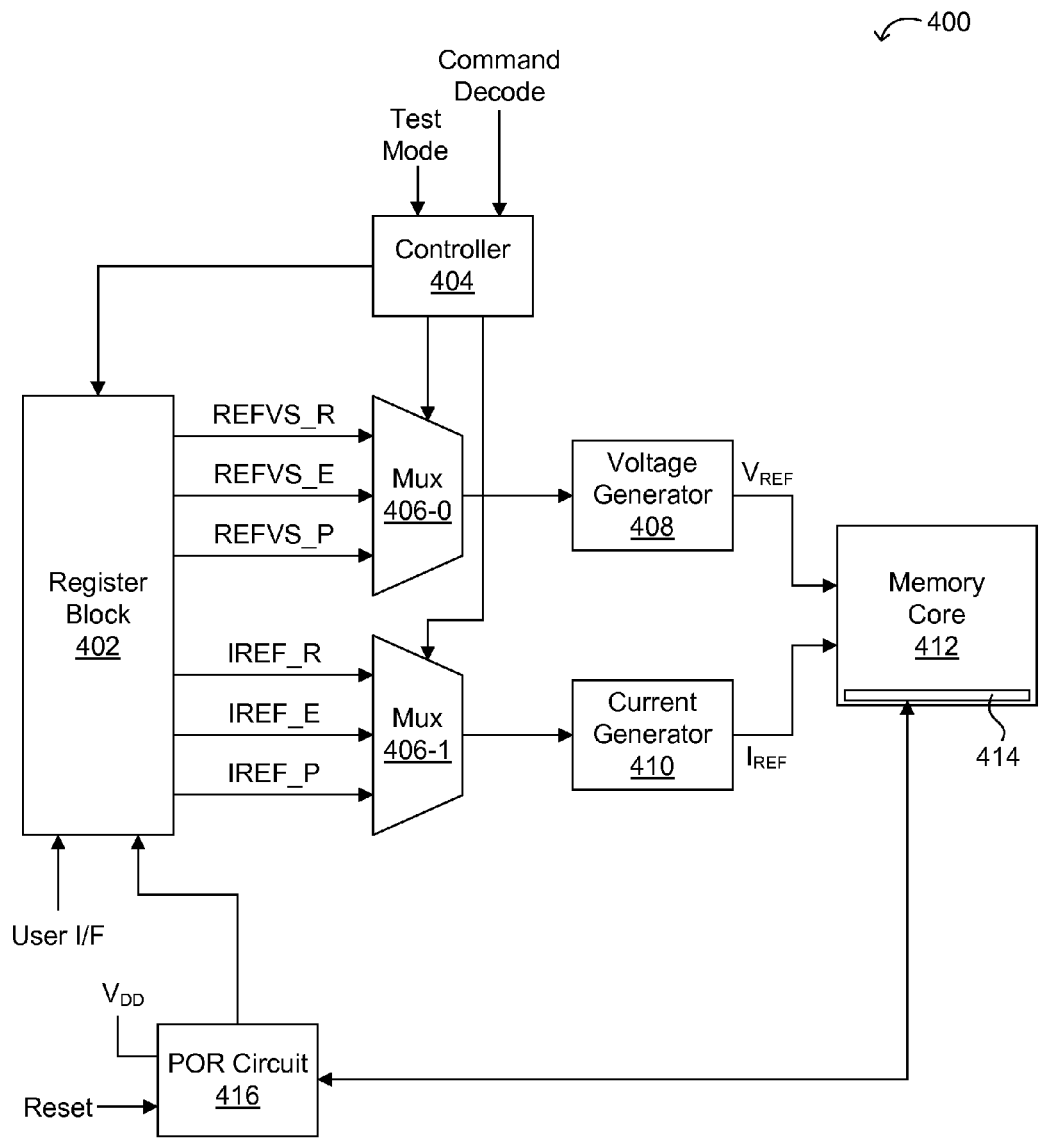
FIG. 4 is a schematic block diagram of an example register, reference, and memory array structure, in accordance with embodiments of the present invention.

Referring now to FIG. 4, shown is a schematic block diagram 400 of an example register, reference, and memory array structure, in accordance with embodiments of the present invention. For example, register block 402 can be implemented using static random access memory (SRAM). Register block 402 can provide REFVS_R (for a read operation), REFVS_E (for an erase operation), and REFVS_P (for a program operation) to multiplexer 406-0, and corresponding IREF_R/E/P data to multiplexer 406-1. Controller 404 can select from among these inputs to multiplexers 406 based on the operating or control mode (e.g., read, erase, program, etc.). An output from multiplexer 406-0 can be fed into voltage generator 408, which can generate reference voltage $V_{REF}$ therefrom. An output from multiplexer 406-1 can be fed into current generator 410, which can generate reference current $I_{REF}$ therefrom.

Reference voltage $V_{REF}$ and reference current $I_{REF}$ can be supplied to memory array or core 412. References $V_{REF}$ and $I_{REF}$ can be used more directly (e.g., at sense amplifiers) or may be used to generate other supplies used in operations on programmable impedance elements to carry out the given mode of operation in memory core 412. For example, one or more of VBL_Prog, VBL_Erase, VS_Prog, VS_Erase, as well as other supplies related to reading, programming, erasing, or other operations of a programmable impedance element, can be generated from reference voltage $V_{REF}$ and/or reference current $I_{REF}$. Alternatively, or in addition, other supplies that define verify (e.g., program verify, erase verify) and read trip points, may also be generated from reference voltage $V_{REF}$ and/or reference current $I_{REF}$. In any event, reference voltage $V_{REF}$ and/or reference current $I_{REF}$ may be used in operations (e.g., program operations, erase operations, read operations) on programmable impedance elements.

Controller 404 can send signals to multiplexers 406-0 and 406-1, and may also determine and decode the received command. Controller 404 can also control access to the register bits in register block 402. In this way, the operating widow can be programmed to improve margin and endurance of the programmable impedance elements in the memory array 412. In addition, test modes (e.g., to determine distribution, etc.) can be used to override data in register block 402. Further, different parts or memory cores 412 can be independently programmed (e.g., for different applications, etc.).

Settings for register block 402 may be based on various standard operating ranges, but can also be programmed on lot-by-lot or device-by-device basis. Also, values for different operations (e.g., program operations, write operations, read operations, etc.) can be independently programmed in register block 402. However, protection circuitry may be included in order to restrict such independently programmed values in some cases, such as when a programmed window might be reversed or otherwise render inapplicable results based on the actual programmed data values.

Power on reset (POR) circuitry or state machine 416, which can receive a reset signal, can access designated register data portion 414 and read out data from that dedicated section of memory array 412. Designated register data portion 414 may alternatively be located outside of memory core 412. In any event, this accessed data that is associated with memory core 412 may then be loaded into register block 402. In this way, information specific to this device can be programmed into the memory core, and whenever the device is powered on (e.g., as detected by $V_{DD}$ supply) or otherwise reset, this data can be loaded into register 402. This is because the memory core, including designated register data portion 414 may include non-volatile memory. Also, different applications-based information can be stored in non-volatile memory designated register data portion 414. In some cases, this dedicated portion of memory may not be accessible to the user. However, some applications may allow access to these designated locations, such as in a test mode.

Also, the non-volatile memory cells in designated register data portion 414 may be substantially identical to those in a remaining portion of memory core 412. For example, memory core 412 can include a plurality of memory cells that each can include a programmable impedance element or PMC. However, in some cases there may be some variety between the cells (e.g., programmable impedance element-based cells) of designated register data portion 414 relative to the cells found in other portions of memory core 412. For example, the cells of designated register data portion 414 may have a substantially similar structure relative to the other cells, but in order to accommodate higher retention for the critical data stored therein, the cells of designated register data portion 414 may be varied so as to provide improved retention.

In one or more test modes, controller 404 can override one or more values stored in register 402. When the test mode is complete, data in register block 402 can revert to the data that was previously stored in the register. For example, registers 402 may be implemented as two storage bits per register cell, one such bit representing an override value that is only enabled during predetermined modes (e.g., test mode, etc.), and another bit storing the data programmed outside of the test mode (e.g., during normal operation, power up, etc.). As another example, registers 402 may be implemented as a single bit per cell or stored data bit, and data can be reverted to its previous state by accessing designated register data portion 414 and asserting the reset signal upon completion of the test mode.

In addition, registers 402 may be programmable by controller 404 and/or by a user via a separate or combined user interface. In this way, a user may be able to program data into registers 402 in order to override or change previous values therein. Particular embodiments may also support independently controlled operating windows for different memory cores 412. For example, controller 404 can set the register values in 402 different for different memory cores 412. For example, register block 402 may include dedicated sectors (e.g., a widened register or increased register bit length) for each memory core, or register block 402 may be replicated for each memory core 412. This may be utilized whereby one memory array 412 is dedicated to one application (e.g., code), while another memory array 412 may be dedicated to another application (e.g., data). In this way, register block 402 may accommodate independently programmable operating windows in support of different operations for different memory cores 412. In particular embodiments, independent memory functions (e.g., simultaneous memory operations), such as programming one memory core 412 while reading from another memory core 412, can be supported by essentially dedicating programmable operating window data for each memory core.

As shown below in Tables 1-8, various forms and types of data values can be stored in register block 402. These example values can be mapped to reference voltages, reference currents, as well as other voltages, currents, and resistances, that are related to programmable impedance element or PMC operations. Also, as discussed above, register block 402 can be programmed in a variety of ways, such as by user programming, test mode override, and power on/reset where the data is accessed from dedicated non-volatile memory located within or in association with memory core 412.

Examples of read reference voltage select options are shown below in Table 1:

| REFRVS[3:0] | VREF (V) | VPMC (V) |
|---|---|---|
| 0000 | VSS + 0.10 | 0.10 |
| 0001 | VSS + 0.12 | 0.12 |
| 0010 | VSS + 0.14 | 0.14 |
| 0011 | VSS + 0.16 | 0.16 |
| 0100 | VSS + 0.18 | 0.18 |
| 0101 | VSS + 0.20 | 0.20 |
| 0110 | VSS + 0.22 | 0.22 |
| 0111 | VSS + 0.24 | 0.24 |
| 1000 | VSS + 0.26 | 0.26 |
| 1001 | VSS + 0.28 | 0.28 |
| 1010 | VSS + 0.30 | 0.30 |
| 1011 | VSS + 0.32 | 0.32 |
| 1100 | VSS + 0.34 | 0.34 |
| 1101 | VSS + 0.36 | 0.36 |
| 1110 | VSS + 0.38 | 0.38 |
| 1111 | VSS + 0.40 | 0.40 |

Examples of program verify reference voltage select options are shown below in Table 2:

| REFPVS[3:0] | VREF (V) | VPMC (V) |
|---|---|---|
| 0000 | VSS + 0.10 | 0.10 |
| 0001 | VSS + 0.12 | 0.12 |
| 0010 | VSS + 0.14 | 0.14 |
| 0011 | VSS + 0.16 | 0.16 |
| 0100 | VSS + 0.18 | 0.18 |
| 0101 | VSS + 0.20 | 0.20 |
| 0110 | VSS + 0.22 | 0.22 |
| 0111 | VSS + 0.24 | 0.24 |
| 1000 | VSS + 0.26 | 0.26 |
| 1001 | VSS + 0.28 | 0.28 |
| 1010 | VSS + 0.30 | 0.30 |
| 1011 | VSS + 0.32 | 0.32 |
| 1100 | VSS + 0.34 | 0.34 |
| 1101 | VSS + 0.36 | 0.36 |
| 1110 | VSS + 0.38 | 0.38 |
| 1111 | VSS + 0.40 | 0.40 |

Examples of erase verify reference voltage select options are shown below in

| REFEVS[3:0] | VREF (V) | VPMC (V) |
|---|---|---|
| 0000 | VSS + 0.10 | 0.10 |
| 0001 | VSS + 0.12 | 0.12 |
| 0010 | VSS + 0.14 | 0.14 |
| 0011 | VSS + 0.16 | 0.16 |
| 0100 | VSS + 0.18 | 0.18 |
| 0101 | VSS + 0.20 | 0.20 |
| 0110 | VSS + 0.22 | 0.22 |
| 0111 | VSS + 0.24 | 0.24 |
| 1000 | VSS + 0.26 | 0.26 |
| 1001 | VSS + 0.28 | 0.28 |
| 1010 | VSS + 0.30 | 0.30 |
| 1011 | VSS + 0.32 | 0.32 |
| 1100 | VSS + 0.34 | 0.34 |
| 1101 | VSS + 0.36 | 0.36 |
| 1110 | VSS + 0.38 | 0.38 |
| 1111 | VSS + 0.40 | 0.40 |

Examples of erase verify target resistances for a first array are shown below in Table 4:

| Mode | Ratio | REFEVS [3:0] | VPMC (V) | IRF_ESIR [1:0] | IREF (uA) | Isense (uA) | Rtarget (Kohm) |
|---|---|---|---|---|---|---|---|
| Erase | 6 | 0101 | 0.2 | 00 | 4 | 0.66 | 300 |
| Verify | 6 | 0101 | 0.2 | 01 | 6 | 1.00 | 200 |
| | 6 | 0101 | 0.2 | 10 | 8 | 1.33 | 150 |

-continued

| Mode | Ratio | REFEVS [3:0] | VPMC (V) | IRF_ESIR [1:0] | IREF (uA) | Isense (uA) | Rtarget (Kohm) |
|---|---|---|---|---|---|---|---|
|  | 6 | 0101 | 0.2 | 11 | 10 | 1.67 | 120 |
|  | 6 | 1111 | 0.4 | 00 | 4 | 0.66 | 600 |
|  | 6 | 1111 | 0.4 | 01 | 6 | 1.00 | 400 |
|  | 6 | 1111 | 0.4 | 10 | 8 | 1.33 | 300 |
|  | 6 | 1111 | 0.4 | 11 | 10 | 1.67 | 240 |

Examples of erase verify target resistances for a second array are shown below in Table 5:

| Mode | Ratio | REFEVS [3:0] | VPMC (V) | IRF_ESIR [1:0] | IREF (uA) | Isense (uA) | Rtarget (Kohm) |
|---|---|---|---|---|---|---|---|
| Erase | 7 | 0101 | 0.2 | 00 | 4 | 0.57 | 350 |
| Verify | 7 | 0101 | 0.2 | 01 | 6 | 0.86 | 233 |
|  | 7 | 0101 | 0.2 | 10 | 8 | 1.14 | 175 |
|  | 7 | 0101 | 0.2 | 11 | 10 | 1.43 | 140 |
|  | 7 | 1111 | 0.4 | 00 | 4 | 0.57 | 700 |
|  | 7 | 1111 | 0.4 | 01 | 6 | 0.86 | 466 |
|  | 7 | 1111 | 0.4 | 10 | 8 | 1.14 | 350 |
|  | 7 | 1111 | 0.4 | 11 | 10 | 1.43 | 280 |

Examples of program verify target resistances for the first array are shown below in Table 6:

| Mode | Ratio | REFEVS [3:0] | VPMC (V) | IRF_ESIR [1:0] | IREF (uA) | Isense (uA) | Rtarget (Kohm) |
|---|---|---|---|---|---|---|---|
| Prog | 0.5 | 0101 | 0.2 | 00 | 4 | 8 | 25.0 |
| Verify | 0.5 | 0101 | 0.2 | 01 | 6 | 12 | 16.6 |
|  | 0.5 | 0101 | 0.2 | 10 | 8 | 16 | 12.5 |
|  | 0.5 | 0101 | 0.2 | 11 | 10 | 20 | 10.0 |
|  | 0.5 | 1111 | 0.4 | 00 | 4 | 8 | 50.0 |
|  | 0.5 | 1111 | 0.4 | 01 | 6 | 12 | 33.3 |
|  | 0.5 | 1111 | 0.4 | 10 | 8 | 16 | 25.0 |
|  | 0.5 | 1111 | 0.4 | 11 | 10 | 20 | 20.0 |

Examples of program verify target resistances for the second array are shown below in Table 7:

| Mode | Ratio | REFEVS [3:0] | VPMC (V) | IRF_ESIR [1:0] | IREF (uA) | Isense (uA) | Rtarget (Kohm) |
|---|---|---|---|---|---|---|---|
| Prog | 0.25 | 0101 | 0.2 | 00 | 4 | 16 | 12.5 |
| Verify | 0.25 | 0101 | 0.2 | 01 | 6 | 24 | 8.33 |
|  | 0.25 | 0101 | 0.2 | 10 | 8 | 32 | 6.25 |
|  | 0.25 | 0101 | 0.2 | 11 | 10 | 40 | 5.0 |
|  | 0.25 | 1111 | 0.4 | 00 | 4 | 16 | 25.0 |
|  | 0.25 | 1111 | 0.4 | 01 | 6 | 24 | 16.6 |
|  | 0.25 | 1111 | 0.4 | 10 | 8 | 32 | 12.5 |
|  | 0.25 | 1111 | 0.4 | 11 | 10 | 40 | 10.0 |

Examples of read verify target resistance selections are shown below in Table 8:

| Mode | Ratio | REFEVS [3:0] | VPMC (V) | IRF_ESIR [1:0] | IREF (uA) | Isense (uA) | Rtarget (Kohm) |
|---|---|---|---|---|---|---|---|
| Read | 2 | 0101 | 0.2 | 00 | 4 | 2 | 100.0 |
|  | 2 | 0101 | 0.2 | 01 | 6 | 3 | 66.66 |
|  | 2 | 0101 | 0.2 | 10 | 8 | 4 | 50.00 |
|  | 2 | 0101 | 0.2 | 11 | 10 | 5 | 40.00 |
|  | 2 | 1111 | 0.4 | 00 | 4 | 2 | 200.0 |
|  | 2 | 1111 | 0.4 | 01 | 6 | 3 | 133.3 |
|  | 2 | 1111 | 0.4 | 10 | 8 | 4 | 100.0 |
|  | 2 | 1111 | 0.4 | 11 | 10 | 5 | 80.00 |
|  | 2 | 0000 | 0.1 | 00 | 4 | 2 | 50.0 |
|  | 2 | 0000 | 0.1 | 01 | 6 | 3 | 33.33 |
|  | 2 | 0000 | 0.1 | 10 | 8 | 4 | 25.00 |
|  | 2 | 0000 | 0.1 | 11 | 10 | 5 | 20.00 |

Figure 5:
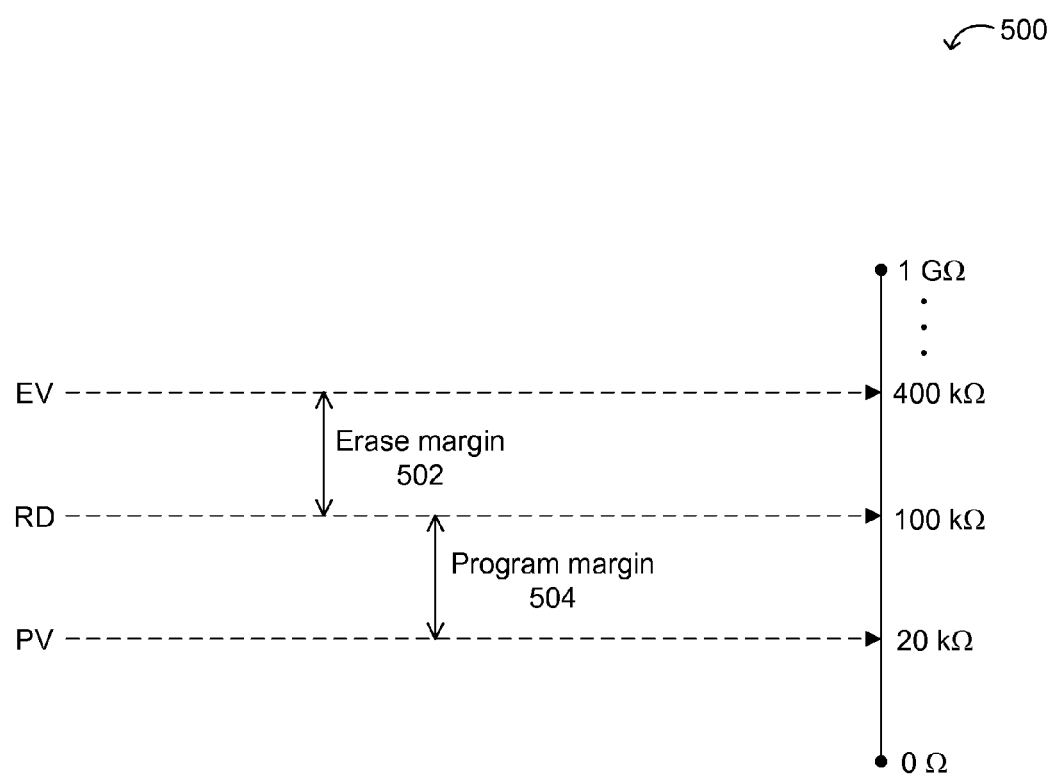
FIG. 5 is a diagram of an example programmable impedance element operation window in accordance with embodiments of the present invention.

Referring now to FIG. 5, shown is a diagram of an example programmable impedance element operation window 500 in accordance with embodiments of the present invention. Traditional CBRAM/ReRAM devices may have a fixed operating window. In addition, the margin for each state (e.g., state '0' and state '1') may be substantially fixed. More specifically, the resistance trip point at which 1's and 0's are defined may be substantially fixed.

In these examples, the resistance level of the low-R state of CBRAM/ReRAM devices may be described as varying inversely with the maximum current allowed to flow through the cell during programming. In this view, any resistance level is possible, and no particular resistance level has any particular significance. In contrast, the approach of particular embodiments recognizes that the quantum of conductance, $G0=2h^2/e=1/(12.9 k\Omega)$, provides an absolute scale for resistance. Metallic wires with atomic-scale constrictions may typically have conductance values on the order of G0. CBRAM/ReRAM cells programmed to on-state resistances on the order of 1/G0 or less are therefore likely to have formed a continuous metallic path, and CBRAM/ReRAM cells intentionally operated so as to form a continuous metallic path may inevitably have on-state resistances on the order of 1/G0=12.9 or less. Therefore, special physical significance may exist for algorithms designed to operate CBRAM/ReRAM cells at resistances on the order of 1/G0 or less.

The on-state retention of some example CBRAM cells may be improved by operating at resistances levels below 1/G0, indicating that a continuous metallic filament has improved stability as compared to discontinuous filaments. This result is unexpected from the traditional point of view of resistance in CBRAM/ReRAM devices, meaning a practical advantage can result from operating at the special resistance level of 1/G0 and lower.

The reliability and performance characteristics of CBRAM can depend heavily on the operating window. As used herein "operating window" or "window of operation" can be defined as the resistance range between a program verify (PV) and an erase verify (EV). Program verify, which can occur as part of a program operation, may be a resistance value at which a programmable impedance element may be programmed (e.g., store a '1' data state by formation of a conductive path between electrodes). Erase verify, which can occur as part of an erase operation, may be a resistance value at which a programmable impedance element may be erased (e.g., store a '0' data state by disconnecting the conductive path). Another important component may be the read trip point resistance (RD), which can occur as part of a read operation to determine whether the stored state of the cell is a '1' state or a '0' state.

As shown in the example of FIG. 5, a distance between read and verify points can determine the margin a cell has for failure. For example, an erase margin 502 may be the difference between read and erase verify points, and a program margin 504 may be the difference between read and program verify points. Noise and other operating parameters can also eat into this margin. In addition, the margin can effect the retention lifetime of a bit of the programmable impedance element. The erase and program verify points can affect performance and endurance because they set how hard one must exercise the cell. Moving from, e.g., 10 kΩ to 50 kΩ requires much less energy than moving from, e.g., 5 kΩ to 100 MΩ. The wide distance may require more energy in the form of current, time, and/or voltage. Further, the wide distance could wear the cell out much sooner, resulting in lower endurance.

Figure 6:
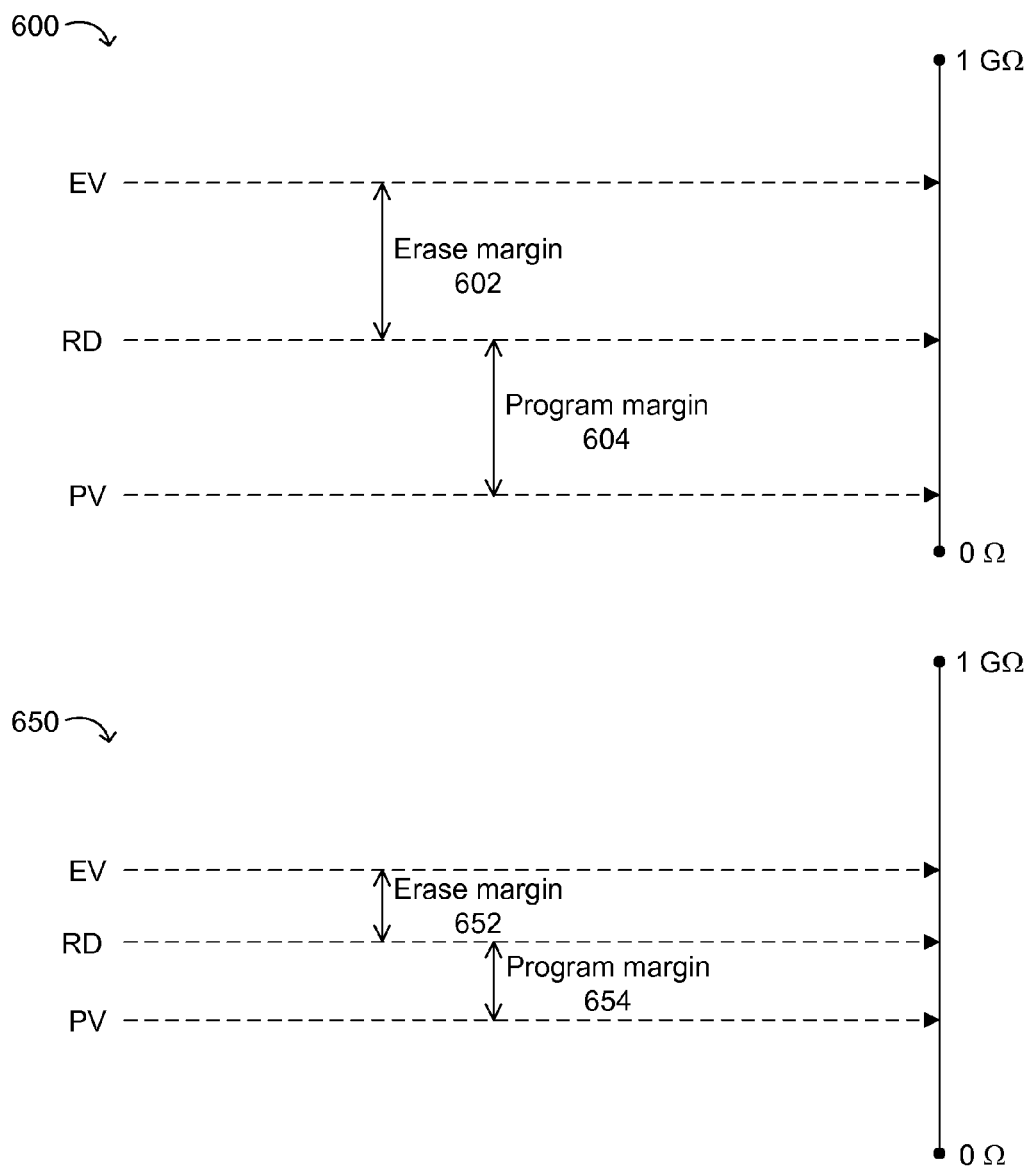
FIG. 6 shows example programmable impedance element operation windows optimized for retention, endurance, and performance, in accordance with embodiments of the present invention.

FIG. 6 shows example programmable impedance element operation windows optimized for retention, endurance, and performance, in accordance with embodiments of the present invention. In particular embodiments, all three key values (EV, PV, and RD) can be optimized and set independently during test or device characterization, and their values may be stored in non-volatile designated register data portion 414 in memory core 412. As discussed above, data from the designated register data portion 414 can be provided to registers 402 to be used in generating reference voltage $V_{REF}$ and/or reference current $I_{REF}$. In this way, integrated circuit die can be optimized for different applications depending on performance and/or reliability needs.

An example operating window optimized for retention is shown in 600. For example, an erase margin 602 may be the difference between read and erase verify points, and a program margin 604 may be the difference between read and program verify points. An example operating window optimized for endurance and performance is shown in 650. For example, an erase margin 652 may be the difference between read and erase verify points, and a program margin 654 may be the difference between read and program verify points. As seen in comparing examples 600 and 650, erase and program margins are greater in example 600 (optimized for retention) as compared to those in example 650 (optimized for endurance and performance).

Also in particular embodiments, the operating window can be optimized to compensate for process variation. In addition, the read trip point can be optimized to favor an erased bit since this is a natural state of the bit, and does not need as much margin. Further, for a same window, more margin can be given to one side or the other (e.g., the difference between read and erase/program verify points) in order to maximize reliability.

In one implementation, the non-volatile designated register data portion 414 in memory core 412 may control (e.g., via register block 402) the reference current used to compare to the programmable impedance element cell during the operations of read, program verify, and/or erase verify. Alternative applications can use registers to control which reference cell gets chosen, or which reference voltage. Thus, particular embodiments can support a variety of register-based implementations configured to store data representing program verify values, read trip point resistance values, erase verify values, etc., that define an operating window for a programmable impedance element.

Particular embodiments can also be extended to modify the operating window for different areas of the array, such as to provide different performance and reliability characteristics in different portions, cores, or arrays 412 of memory. For example, the program verify level can be set to a level near 1/G0=12.9 kΩ to help ensure that the conductive filament or conductive path in the cell is a continuous metallic wire, providing the improved retention, as described above.

Particular embodiments may also support dynamically changing the operating window as the semiconductor device ages, or arrays thereof are cycled more and more. For example, counters may be used to move to different levels and effectively change erase and program margins automatically based on the counter results. In one example, designated register data portion 414 can be updated to reflect changed erase verify, program verify, read trip point resistance, etc., values based on such counter results. As a result, register block 402 can be updated via POR circuit 416, as discussed above. In another example, incremented values based on the counter results can be dynamically determined based on data output from register block 402. In this case, data that is read from register block 402 can then be updated by subsequent circuitry based on the counter results, before being provided as outputs REFVS_R/E/P, IREF_R/E/P to multiplexers 406.

Figure 7:
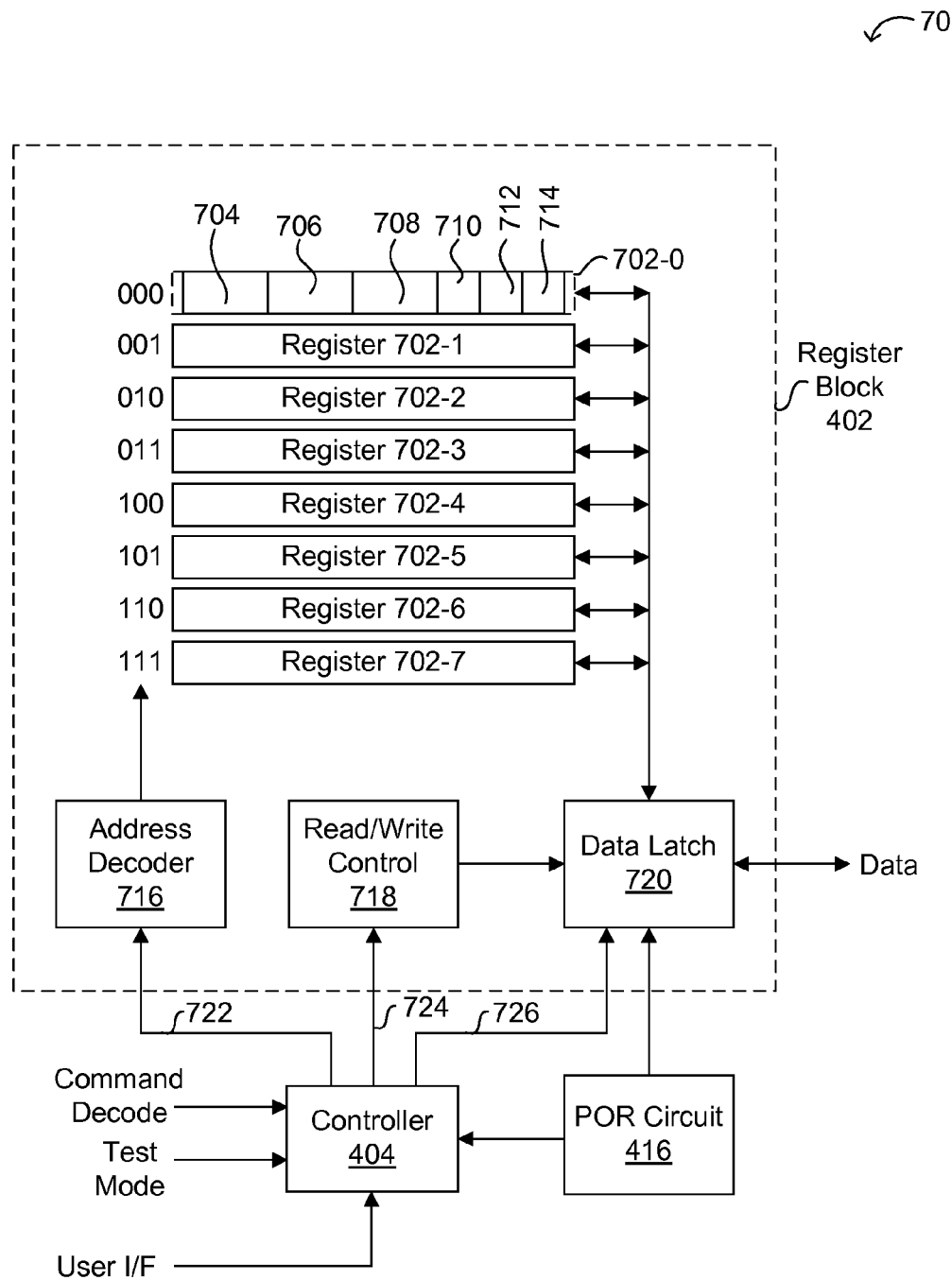
FIG. 7 is a schematic block diagram of an example register control structure in accordance with embodiments of the present invention.

Referring now to FIG. 7, shown is a schematic block diagram 700 of an example register control structure in accordance with embodiments of the present invention. In this example, register block 402 can include eight registers 702 (e.g., 702-0, 702-1, . . . 702-7). Each register 702 can include a number of fields. For example, field 704 may be a 4-bit wide field to store data representing read reference voltage select options (see, e.g., Table 1 above). Also for example, field 706 may be a 4-bit wide field to store data representing program verify reference voltage select options (see, e.g., Table 2 above). Also for example, field 708 may be a 4-bit wide field to store data representing erase verify reference voltage select options (see, e.g., Table 3 above).

Fields 710, 712, and 714 may each be 2-bit fields to select reference current used during program verify, erase verify, or read operations. For example, field 710 can correspond to IRF_ESIR as shown in Tables 4 and 5 above for erase verify target resistances. Also for example, field 712 can correspond to IRF_PSIR as shown in Tables 6 and 7 above for program verify target resistances. Also for example, field 714 can correspond to IRF_RSIR as shown in Table 8 above for read verify target resistances.

Register block 402 can also include address decoder 716, which can receive signals 722 (e.g., address, address load, etc.) from controller 404, and may provide 3-bit decoded values to address one of eight registers 702. Read/write control 718 can receive signals 724 (e.g., read control signal, write control signal, etc.) from controller 404, and may provide a control signal to data latch 720. Data latch 720 can receive signals 726 (e.g., read data strobe, data out enable, load data, etc.) from controller 404, and may receive or provide the data to/from register block 402.

Figure 8:
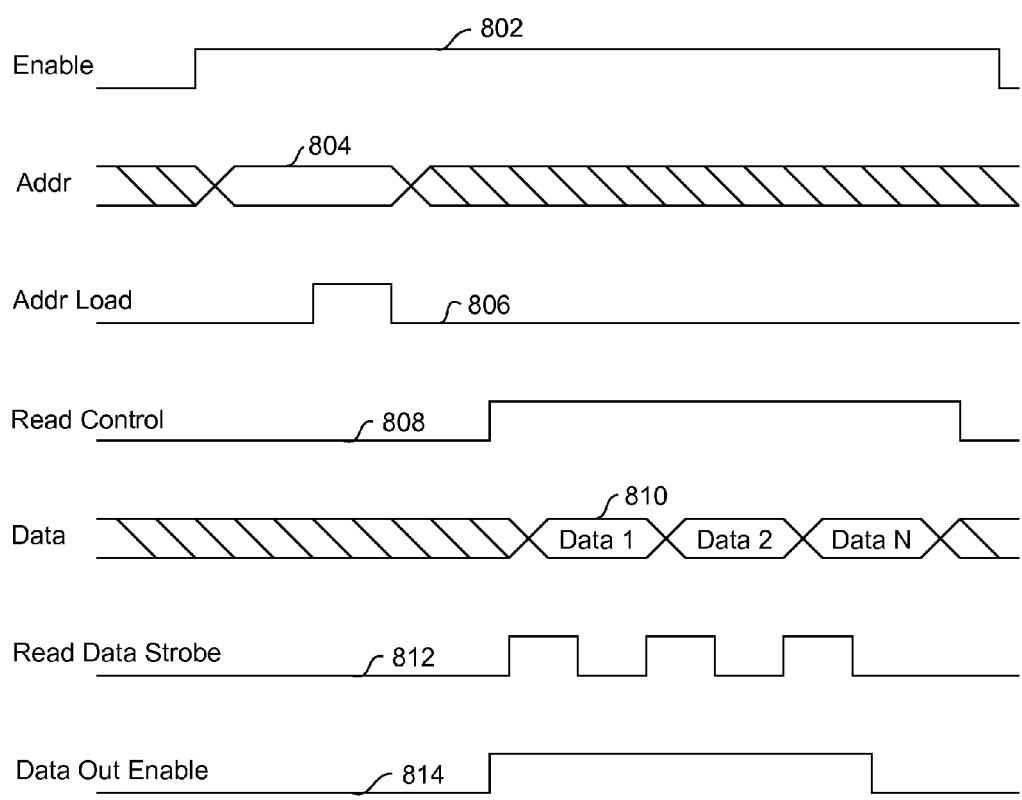
FIGS. 8 and 9 are timing diagrams showing example register read and write operations, respectively, in accordance with embodiments of the present invention.

Referring now to FIG. 8, shown is a timing diagram of example register read operations in accordance with embodiments of the present invention. One or more enable signals as shown in waveform 802 can be brought high in order to enable register access. Address signals can be provided as shown in waveform 804, along with an address load signal as shown in waveform 806. The address load signal may be used to latch the address into the address decoder 716. A read control signal 808 can be provided via signals 724 to read/write control 718. Data may be provided as shown in example waveform 810, with corresponding read data strobe as shown in waveform 812, and data out enable as shown in waveform 814. Each time the read data strobe signal is pulsed, an address counter in address decoder 716 may increment the address by one in order to read from a next register 702. Also, the address may rollover (e.g., from 111 to 000) when a highest address is reached. In this way, data from the entire register block 402 can be read in a multi-register read operation. Alternatively, only a single designated register 702 can be read when only a single read data strobe pulse is provided.

Figure 9:
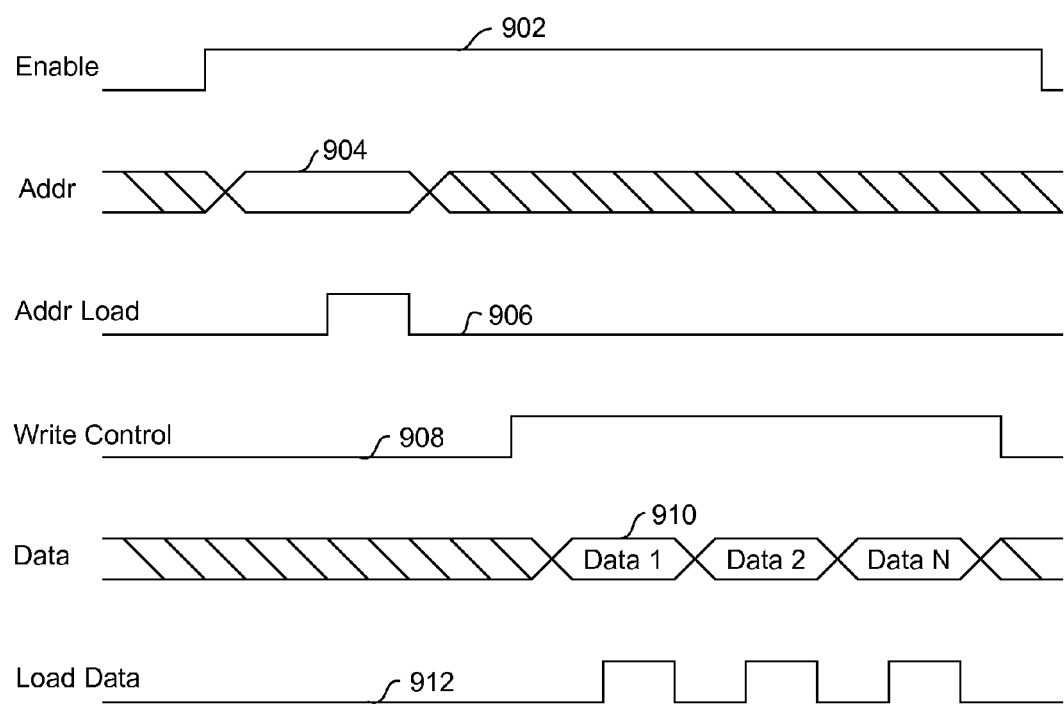

Referring now to FIG. 9, shown is a timing diagram of example register write operations in accordance with embodiments of the present invention. One or more enable signals as shown in waveform 902 can be brought high in order to enable register access. Address signals can be provided as shown in waveform 904, along with an address load signal as shown in waveform 906. The address load signal may be used to latch the address into the address decoder 716. A write control signal 908 can be provided via signals 724 to read/write control 718. Data may be provided to register block 402 as shown in example waveform 910, with corresponding load data control as shown in waveform 912. Each time the load data control signal is pulsed, an address counter in address decoder 716 may increment the address by one in order to read from a next register 702. Also, the address may rollover (e.g., from 111 to 000) when a highest address is reached. In this way, data from the entire register block 402 can be written to in a multi-register write operation. Alternatively, only a single designated register 702 can be written to when only a single load data control pulse is provided.

In another embodiment, a method of controlling a programmable impedance element in a memory array, can include: (i) programming a register with data that represents an erase verify value, a program verify value, and a read trip point resistance value, for the memory array; (ii) determining a mode of operation for the memory array; (iii) reading the register to obtain data corresponding to the mode of operation; and (iv) generating a reference voltage based on the register data, where the reference voltage is used to perform an operation on the programmable impedance element corresponding to the mode of operation.

For example, if the mode of operation is a program operation, the reference voltage may be used in performing a program verify as part of the program operation on the programmable impedance element. Similarly, if the mode of operation is an erase operation, the reference voltage may be used to perform an erase verify as part of the erase operation on the programmable impedance element. Also, if the mode of operation is a read operation, the reference voltage may be used in setting the read trip point for performing the read operation on the programmable impedance element. A reference current may also used in one or more of the above operations.

Figure 10:
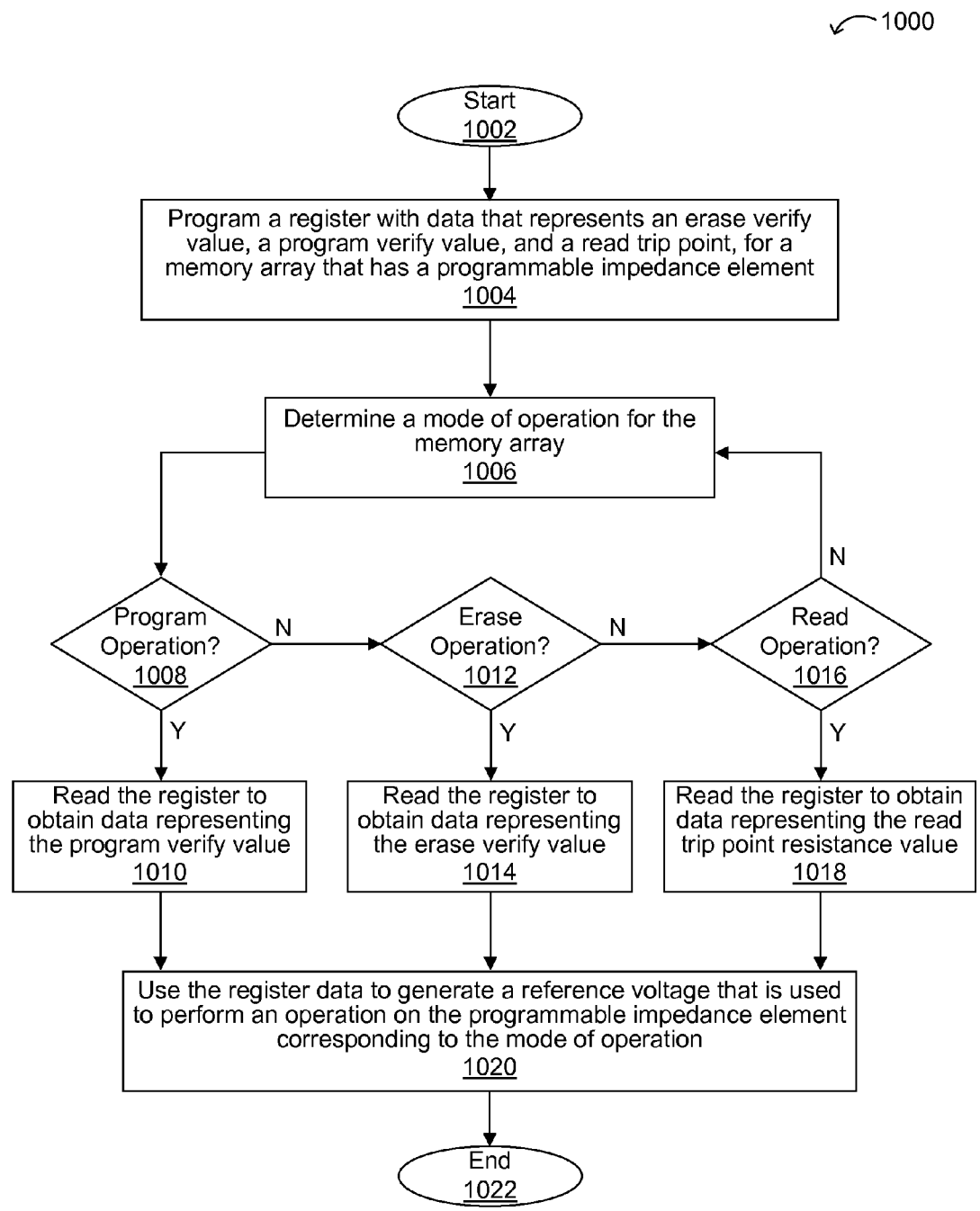
FIG. 10 is a flow diagram of an example method of operating a programmable impedance element in accordance with embodiments of the present invention.

Referring now to FIG. 10, shown is a flow diagram 1000 of an example method of operating a programmable impedance element in accordance with embodiments of the present invention. The flow begins at 1002, and at 1004 a register can be programmed with data that represents an erase verify value, a program verify value, and a read trip point, for a memory array that has a programmable impedance element. At 1006, a mode of operation for the memory array can be determined.

If the mode of operation is determined as a program operation (1008), at 1010 the register can be read to obtain data representing the program verify value. However, if the mode of operation is determined as an erase operation (1012), at 1014 the register can be read to obtain data representing the erase verify value. However, if the mode of operation is determined as a read operation (1016), at 1018 the register can be read to obtain data representing the read trip point resistance value. The data read from the register (e.g., at 1010, 1014, or 1018), can be used to generate a reference voltage at 1020, completing the flow at 1022. As discussed above, the reference voltage (and/or reference current) can be utilized to access the programmable impedance element for the mode of operation.

It is also noted that, while only two storage states (state "0" and state "1") have been significantly described herein, PMCs may also each support more than one memory state. For example, depending on the voltage level controls, instead of a full erase or a full program/write, partial operations (e.g., by applying less/predetermined voltages for forward bias and reverse bias of the PMC) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance and bias voltage characteristics.

As another example, the operating window itself can be dynamically programmed to accommodate multilevel memory storage. In this example, a given cell resistance can be interpreted differently (e.g., as 00, 01, etc.) based on the programmed operating window. In this way, this programmed operating window change can effectively move the target to accommodate different read levels (e.g., for different applications) for a given PMC.

In addition, on-chip current (e.g., $I_{REF}$) and voltage (e.g., $V_{REF}$) measurements can be performed for verification or testing purposes by using the analog current or voltage to control the frequency of an on-chip clock. This on-chip clock frequency can then be measured relatively easily using an external tester during a test mode. The tester may then apply a known current/voltage to the chip and measures the clock frequency. The tester can then switch the chip to use the internal current/voltage source, and then measure the clock frequency. The difference between the two frequency measurements can be used to determine the actual on-chip current/voltage. In this way, reference voltage and current values corresponding to programmed data can be verified.

While the above examples include circuit and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor memory device, comprising:
 a) a memory array having a programmable impedance element;
 b) a register configured to be programmed with data that represents an erase verify value, a program verify value, and a read trip point resistance value, for the memory array;
 c) a register reset circuit coupled to the register and the memory array, wherein the memory array comprises a designated register data portion;
 d) a controller configured to determine a mode of operation for the memory array;

e) a register access circuit configured to read the register to obtain data that corresponds to the mode of operation; and f) a voltage generator configured to generate a reference voltage based on the register data, wherein the reference voltage is used to perform an operation on the programmable impedance element corresponding to the mode of operation.

2. The semiconductor memory device of claim 1, wherein the register access circuit is configured to:

a) read the register to obtain data representing the erase verify value when the mode of operation comprises an erase operation;

b) read the register to obtain data representing the program verify value when the mode of operation comprises a program operation; and c) read the register to obtain data representing the read trip point resistance value when the mode of operation comprises a read operation.

3. The semiconductor memory device of claim 1, wherein the register comprises static random-access memory (SRAM).

4. The semiconductor memory device of claim 1, wherein the register reset circuit is configured to:

a) read data from the designated register data portion; and b) program the register with the data read from the designated register data portion.

5. The semiconductor memory device of claim 1, wherein the designated register data portion comprises a designated programmable impedance element.

6. The semiconductor memory device of claim 1, further comprising a current generator configured to generate a reference current based on the register data, wherein the reference current is used to perform an operation on the programmable impedance element corresponding to the mode of operation.

7. The semiconductor memory device of claim 6, wherein predetermined bits of the data in the register are configured to be used to select the reference current based on the mode of operation.

8. The semiconductor memory device of claim 1, wherein the programmable impedance element comprises:

a) an inert electrode coupled to a first side of a solid electrolyte;

b) an active electrode coupled to a second side of the solid electrolyte, wherein the programmable impedance element is programmed by formation of a conductive path between the active and inert electrodes; and c) a plurality of mobile elements derived from the active electrode, wherein the plurality of mobile elements are reduced in the solid electrolyte to form the conductive path.

9. The semiconductor memory device of claim 8, wherein the conductive path in the programmable impedance element is formed by application of a first voltage across the active and inert electrodes, the conductive path remaining once formed after the first voltage is removed.

10. The semiconductor memory device of claim 8, wherein at least a portion of the conductive path is dissolved to erase the programmable impedance element by application of a second voltage across the active and inert electrodes.

11. The semiconductor memory device of claim 8, wherein the memory array comprises a plurality of memory cells, wherein each of the memory cells comprises:

a) a programmable impedance element having an active electrode coupled to a bit line; and b) a transistor having a drain coupled to the inert electrode of the programmable impedance element, a gate coupled to a word line, and a source coupled to a source line.

12. A method of controlling a programmable impedance element in a memory array, the method comprising:

a) programming a register with data that represents an erase verify value, a program verify value, and a read trip point resistance value, for the memory array, wherein the programming the register comprises reading data from a designated register data portion of the memory array, and programming the register with the data read from the designated register data portion;

b) determining a mode of operation for the memory array;

c) reading the register to obtain data corresponding to the mode of operation; and d) generating a reference voltage based on the register data, wherein the reference voltage is used to perform an operation on the programmable impedance element corresponding to the mode of operation.

13. The method of claim 12, wherein the reading the register comprises:

a) reading the register to obtain data representing the erase verify value when the mode of operation comprises an erase operation;

b) reading the register to obtain data representing the program verify value when the mode of operation comprises a program operation; and c) reading the register to obtain data representing the read trip point resistance value when the mode of operation comprises a read operation.

14. The method of claim 12, wherein at least one of the erase verify value, the program verify value, and the read trip point resistance value, is determined as an optimized value during testing of the programmable impedance element.

15. The method of claim 12, further comprising generating a reference current based on the register data, wherein the reference current is used to perform an operation on the programmable impedance element corresponding to the mode of operation.

16. The method of claim 12, wherein the programming the register comprises overriding the data during a test mode.

17. The method of claim 12, wherein the programming the register comprises using a user interface to allow a user to program the data.

18. An apparatus for controlling a programmable impedance element in a memory array, the apparatus comprising:

a) means for programming a register with data that represents an erase verify value, a program verify value, and a read trip point resistance value, for the memory array, wherein the means for programming the register comprises means for reading data from a designated register data portion of the memory array, and means for programming the register with the data read from the designated register data portion;

b) means for determining a mode of operation for the memory array;

c) means for reading the register to obtain data corresponding to the mode of operation; and d) means for generating a reference voltage based on the register data, wherein the reference voltage is used to perform an operation on the programmable impedance element corresponding to the mode of operation.

* * * * *